(12) United States Patent
Campbell et al.

(10) Patent No.: US 7,009,377 B2
(45) Date of Patent: *Mar. 7, 2006

(54) CARTRIDGE SYSTEM FOR A PROBING HEAD FOR AN ELECTRICAL TEST PROBE

(75) Inventors: Julie A. Campbell, Beaverton, OR (US); Stephen Mark Sekel, Camas, WA (US); Stanley Joseph Sula, Portland, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/996,073

(22) Filed: Nov. 22, 2004

(65) Prior Publication Data

US 2005/0073291 A1    Apr. 7, 2005

Related U.S. Application Data

(63) Continuation of application No. 10/607,791, filed on Jun. 27, 2003, now Pat. No. 6,828,769, which is a continuation of application No. 09/629,258, filed on Jul. 31, 2000, now Pat. No. 6,605,934.

(51) Int. Cl.
  *G01R 31/02* (2006.01)
  *G01R 1/06* (2006.01)

(52) U.S. Cl. ............... 324/72.5; 324/149; 324/754; 439/482

(58) Field of Classification Search ............... None
  See application file for complete search history.

(56) References Cited

U.S. PATENT DOCUMENTS

| | | | |
|---|---|---|---|
| 3,801,766 A | 4/1974 | Morrison, Jr. | |
| 4,209,742 A | 6/1980 | Bender et al. | |
| 4,597,622 A | 7/1986 | Coe | |
| 4,701,703 A | 10/1987 | Malloy | |
| 4,783,625 A | 11/1988 | Harry et al. | |
| 5,061,892 A | 10/1991 | O'Hara et al. | |
| 5,136,237 A | 8/1992 | Smith et al. | |
| 5,220,274 A | 6/1993 | Nightingale et al. | |
| 5,334,931 A | 8/1994 | Clark et al. | |
| 6,175,080 B1 | 1/2001 | Nightingale | |
| 6,218,826 B1 | 4/2001 | Nightingale | |
| 6,466,000 B1 | 10/2002 | Nightingale | |
| 6,605,934 B1 * | 8/2003 | Campbell et al. | 324/72.5 |
| 6,828,769 B1 * | 12/2004 | Campbell et al. | 324/72.5 |

OTHER PUBLICATIONS

U.S. Trademark Electronic Search results indicating Tektronix, Inc. filed an Intent to Use trademark application for the word mark TEKCONNECT to describe electrical/mechanical probe interfaces for oscilloscopes and oscilloscope probes on Feb. 10, 2000, (3 pages).

(Continued)

*Primary Examiner*—Paresh Patel
(74) *Attorney, Agent, or Firm*—Law Office of Karen Dana Oster, LLC

(57) ABSTRACT

A cartridge system includes a main probing head body with electronics positioned therein. Further, the cartridge system includes a probing tip cartridge having a probing tip. A minimally inductive electrical contact mechanism electrically couples the electronics to the probing tip when the probing tip cartridge is in mating relationship with the main probing head body. The types may be, for example, a pointed tip, a socket tip, or a grabber tip. In one preferred embodiment the probing tip cartridge further includes at least one foot.

19 Claims, 9 Drawing Sheets

OTHER PUBLICATIONS

"The Legacy of Innovation Lives On . . . EDN 2000 Innovation of the Year Award Bestowed Upon Tektronix," and article found at www.tek.com, having the date of Apr. 10, 2001. (2 pages).

"Tektronix Strengthens Innovative Oscilloscope Portfolio With NewPrice/ Performance Model," an article found at www.tek.com., having the date of May 31, 2001. (2 pages).

Tektronix Data Sheet, 3 GHz Differential Probes: P7330 * P6330. This data sheet was found at www.tek.com. Aug. 2000 appears to be the date it was published. (2 pages).

Deposito, Joe, "Real-Time Scope Breaks Into 4-GHz Territory With Fast SiGe Technology," an article found at www. planetee.com indicating that is was published by Electronic Design on Jun. 12, 2000. (3 pages).

Tektronix Instruction Manual for the P7330 3.5 GHz Differential Probe. No copyright date could be found, but applicants had it in their posSession around or about May 2001. Attached are the first 3 pages of the manual as well as pp. 49-54.

Tektronix DAta Sheet, High Performance Differential Probes: P350 * P7330 * P6630. This data sheet was found at www. tektronix.com/accessories. Copyright 2003. 4 pages.

* cited by examiner

CARTRIDGE SYSTEM FOR A PROBING HEAD FOR AN ELECTRICAL TEST PROBE

The present application is a continuation of U.S. patent application Ser. No. 10/607,791, filed Jun. 27, 2003, now U.S. Pat. No. 6,828,769. U.S. patent application Ser. No. 10/607,791 is a continuation of U.S. patent application Ser. No. 09/629,258, filed Jul. 31, 2000, now U.S. Pat. No. 6,605,934. The present application is based on and claims priority from these applications, the disclosures of which are hereby incorporated herein by reference.

BACKGROUND OF INVENTION

The present invention relates generally to a cartridge system for a probing head for an electrical test probe, and specifically to a probing head cartridge system that includes a main probing head body and a switchable and replaceable probing tip cartridge.

An electronic test probe generally consists of a probing head, a cable, and a connector. The probing head may have an integral or replaceable probing tip that is suitable for making an electronic contact with electrical components. The probing head is attached to a first end of the cable and the connector is attached to the opposite end of the cable.

Electronic test probes are used to provide an electrical connection between electrical components and testing instruments such as oscilloscopes and other measuring, monitoring, diagnostic, and signal processing instruments. As the size of electrical components decrease, probing tips get smaller.

One type of probing head is a complete unit with an integral, non-replaceable tip. Although this type of probing head provides for an electrical connection with very low resistance, if the tip breaks, the entire head must be replaced. Also, an integral tip limits the user to a single tip unless the user replaces the entire probing head.

Another type of probing head includes a head assembly with a hollow socket that couples with a switchable and replaceable probing tip. One example of this type of probing head is shown in U.S. Des. Pat. No. 354,923 to Nightingale. One problem with this socket-type-probing head is that the tips often slide out of the socket. Another problem is that the small tips are easily lost and, once lost, hard to find. Examples of other references that disclose probes with replaceable tips include U.S. Pat. No. 4,552,465, U.S. Pat. No. 4,849,689 to Gleason et al., Japanese Document JP11258270A, and Japanese Patent No. 10282140. In general, these replaceable probing tips are easily broken and, once broken, hard to remove and replace.

U.S. Pat. No. 5,334,931 to Clarke et al. (the "Clarke reference") sets forth a probing head that may be readily replaced. It is designed with a cantilevered portion that is meant to reduce contact tip breakage. However, if the contact tip does break, it is easy to remove and replace. The Clarke reference does not disclose a solution for modern complicated test probes that include expensive electronics and must have little or no inductance.

U.S. Pat. No. 4,209,742 to Bender et al. (the "Bender reference") is directed to an electrical probe with a modular form of construction for an old technology modular probing head (signal sensing head), a cable with a plug at both ends, and an output termination. One or both plugs are suitable for connecting to the probing head. If the cable is broken, it is simply disconnected at both ends and replaced. Similarly, the probing head can be disconnected and replaced. Because the Bender reference is directed to old technology, it does not disclose a solution for modern complicated test probes that include expensive electronics and must have little or no inductance or capacitance.

BRIEF SUMMARY OF THE INVENTION

Unlike the prior art, the present invention provides a solution for modern complicated test probes that include expensive electronics and must have little or no inductance or capacitance.

The present invention relates generally to a cartridge system for a probing head for an electrical test probe, and specifically to a probing head cartridge system that includes a main probing head body and a switchable and replaceable probing tip cartridge. The body may include a substantial portion of the electronics that make probing heads expensive. Each cartridge would include a fixed tip. However, the cartridges could be made with different types of tips such as a pointed tip, socket tip, or grabber tip. Those embodiments in which the tips are fixed in the cartridge have significantly lower capacitance than designs in which tips are exchanged within the socket.

A cartridge system of the present invention includes a main probing head body with electronics positioned therein. Further, the cartridge system includes a probing tip cartridge having a probing tip. An electrical contact mechanism electrically couples the electronics to the probing tip when the probing tip cartridge is in mating relationship with the main probing head body. The types may be, for example, a pointed tip, a socket tip, or a grabber tip.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
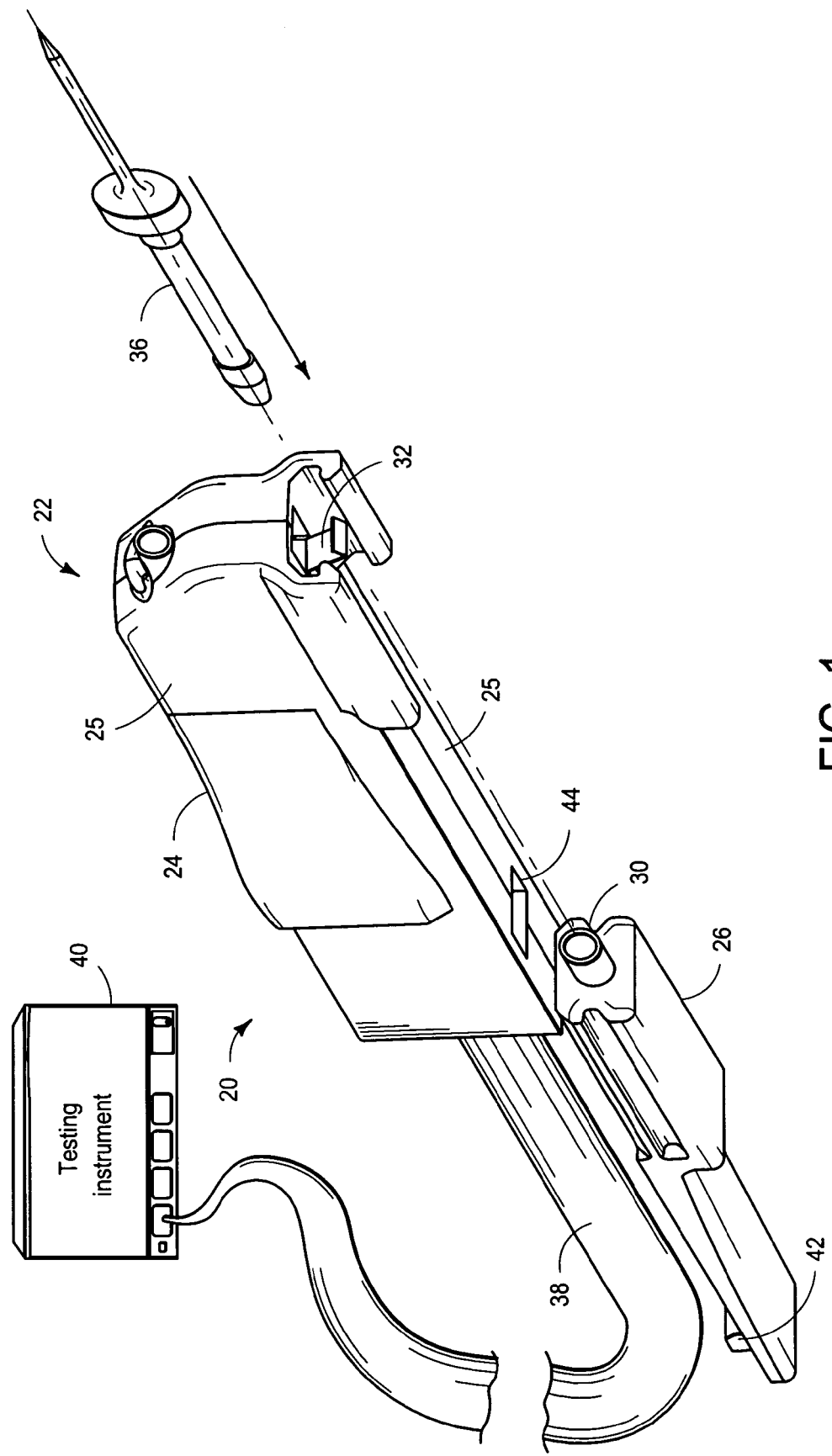
FIG. 1 is an exploded perspective view of one preferred embodiment of a probing head cartridge system of the present invention including a main probing head body and a probing tip cartridge.
Figure 2:
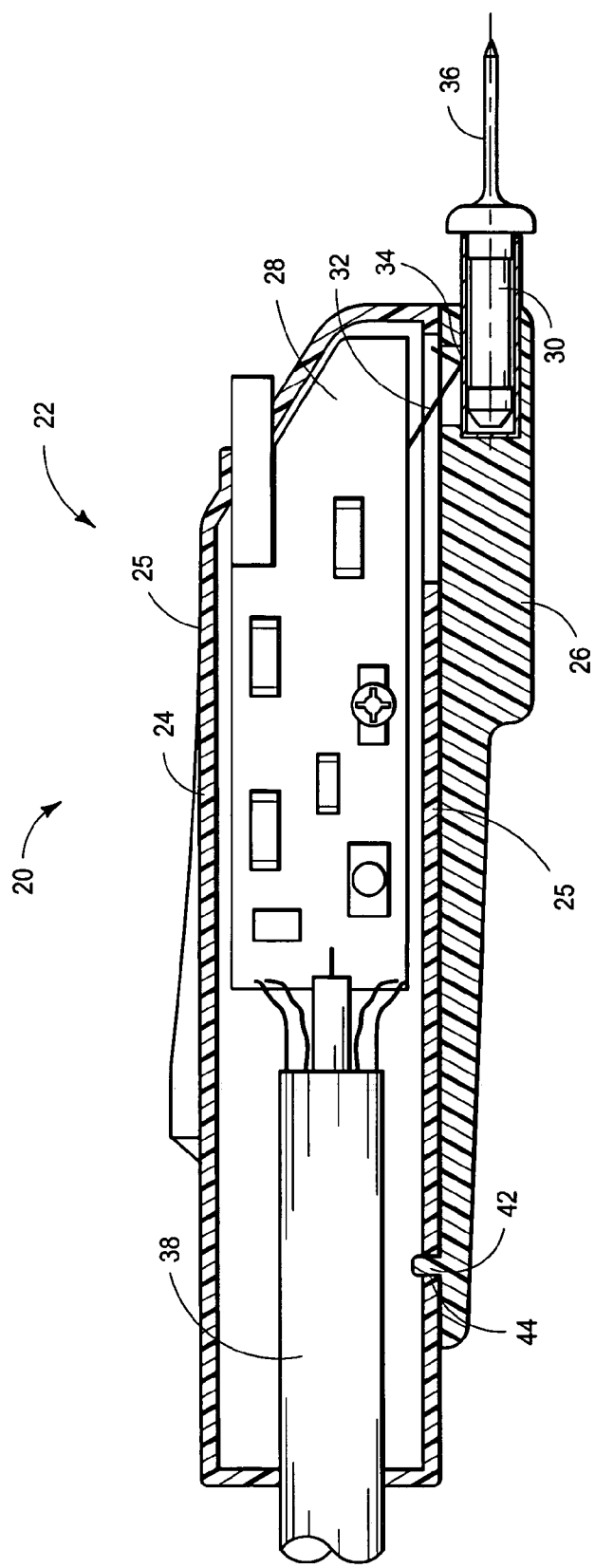
FIG. 2 is a cross-sectional side view of the probing head cartridge system showing the internal electronics and the electrical contact mechanism contacting a conductive surface when the probing tip cartridge is in mating relationship with the main probing head body.
Figure 3:
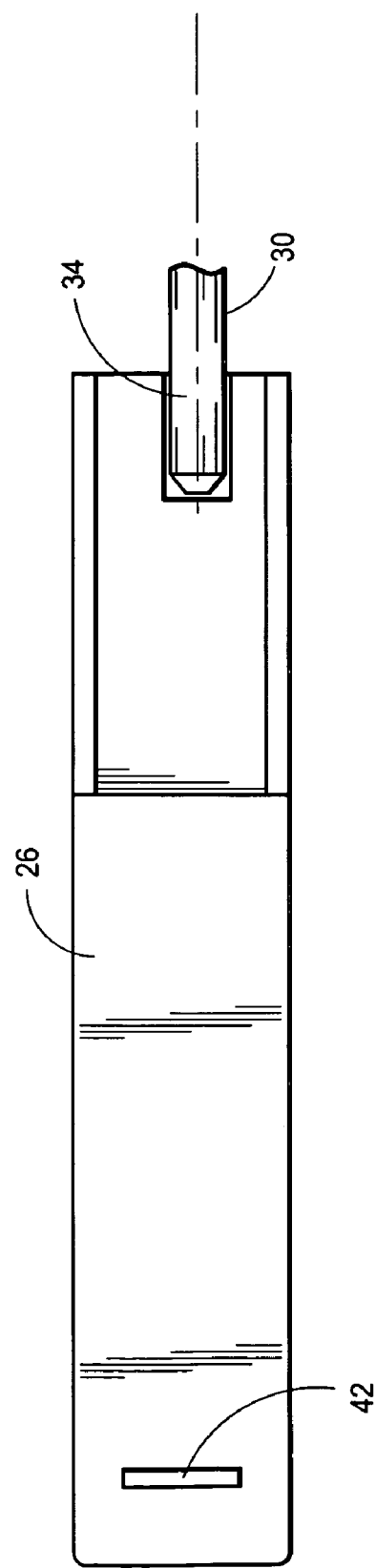
FIG. 3 is a cross-sectional bottom view of the probing tip cartridge.

As shown in FIGS. 1–3, the present invention is directed to a cartridge system 20 for a probing head 22 for an electrical test probe that includes a main probing head body 24 and a switchable and replaceable probing tip cartridge 26. The main probing head body 24 may include a substantial portion of the electronics 28 that make probing heads expensive. And the probing tip cartridge 26 would include a probing tip 30 such as a pointed tip (FIG. 4), socket tip (FIGS. 1 and 2), grabber tip (not shown), or any other type of probing tip.

As shown in FIGS. 1 and 2, the main probing head body 24 has an interior compartment in which the electronics 28 are positioned. The main probing head body 24 also has an external peripheral surface 25. Having electronics in the main probing head body 24 is important because it can be used to amplify a portion of the signal for transmission back to the testing instrument without altering the signal. It should be noted that both active and passive electronics are contemplated as "electronics" herein. Older technology did not need electronics in the probing head 22.

An electrical contact mechanism 32 is electrically coupled to the electronics 28. The electrical contact mechanism 32 may be, for example, a signal spring contact, a leaf spring, a pogo pin, or a coil spring. These exemplary electrical contact mechanisms 32 are not meant to limit the scope of the invention. In the preferred embodiment, the electrical contact mechanism 32 protrudes from the main probing head body 24. This is shown in FIGS. 1 and 2. Further, as shown in FIGS. 1 and 2, the electrical contact mechanism 32 may protrude from the external peripheral surface 25.

Figure 4:
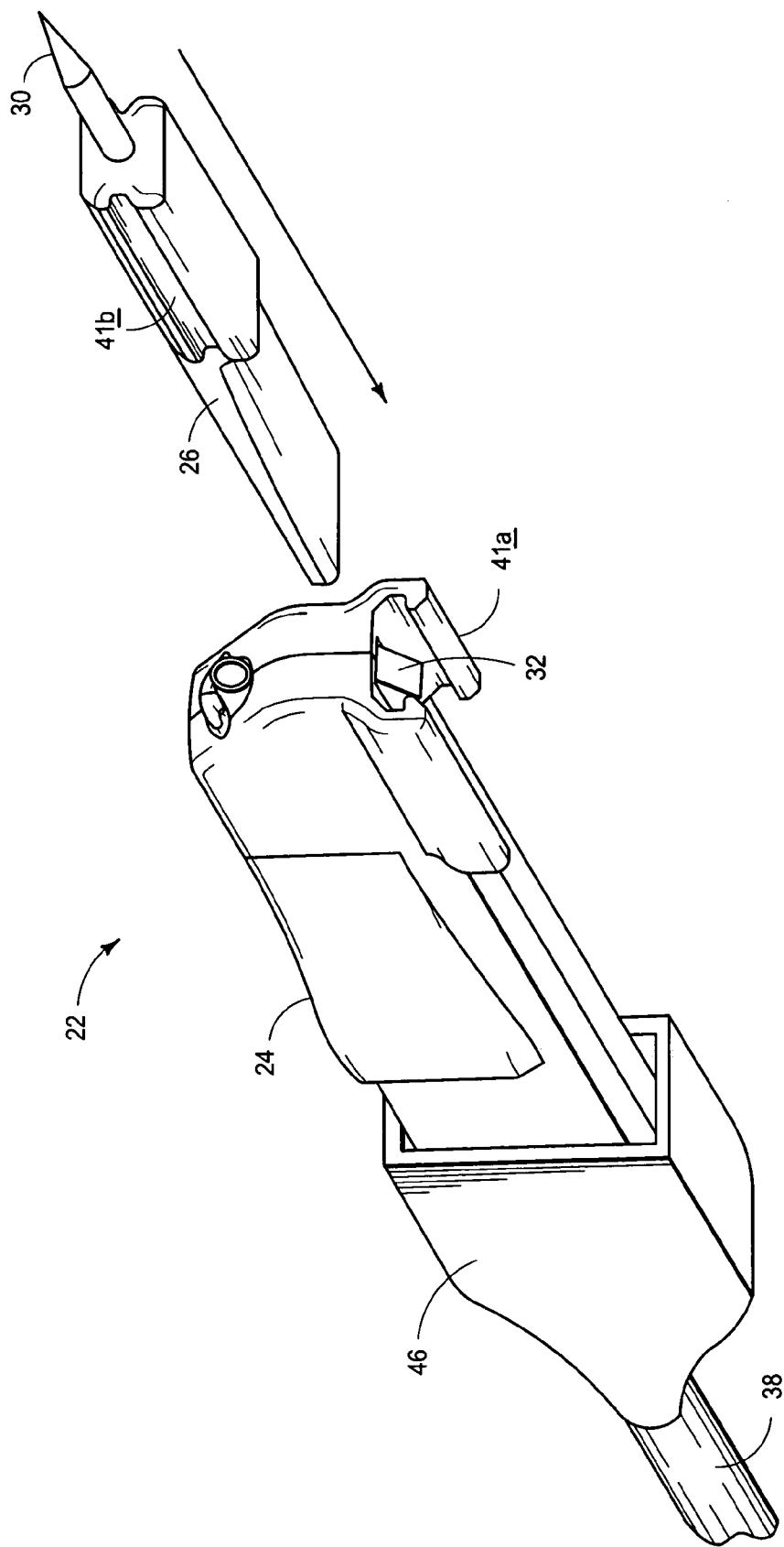
FIG. 4 is an exploded perspective view of an alternate preferred embodiment of a probing head of the present invention.

A probing tip cartridge 26 of the present invention includes a probing tip 30 with a conductive exterior surface such that at least part of the conductive surface is exposed to form an exposed conductive surface 34. FIG. 4 shows an integral probing tip. FIGS. 1–2, however, show a socket probing tip 30 for coupling with a secondary probing tip 36. If a secondary probing tip 36 is used, it is in electrical connectivity with the exposed conductive surface 34. The electrical contact mechanism 32 contacts the conductive surface 34 when the probing tip cartridge 26 is in mating relationship with the main probing head body 24.

In an alternate embodiment (not shown) an electrical contact mechanism could be integrated into the probing tip cartridge 26 so that it protrudes therefrom. In this alternate embodiment (not shown), the electrical contact mechanism would contact a conductive surface on the electronics 28 when the probing tip cartridge 26 was in mating relationship with the main probing head body 24.

If the probing head 22 shown in FIG. 2 were used to probe a component on a circuit board, the signal would follow the following exemplary path. First, as the secondary probing tip 36 touched the circuit board component, the signal would enter the secondary probing tip 36. The signal would then travel from the secondary probing tip 36 to the primary probing tip 30. As the primary tip 30 has an exposed conductive surface 34 the signal would travel from the exposed conductive surface 34 to the electrical contact mechanism 32. The electrical contact mechanism 32 would then allow the signal to flow to the electronics 28. Finally the signal would go through the cable 38 to the testing instrument 40.

The cartridge system as shown preferably has a main probing head body 24 with a set of gripping jaws 41a and a probing tip cartridge 26 with a set of gripping surfaces or rails 41b. The gripping jaws 41a grip the gripping surfaces 41b to hold the probing tip cartridge 26 in place. The probing tip cartridge 26 may be further secured by a foot 42 extending into the main probing head body 24 through an opening 44 defined therein. Alternatively, as shown in FIG. 4, the probing tip cartridge 26 may be held in place by a rear boot 46 gripping both the probing tip cartridge 26 and the main probing head body 24.

Figure 5:
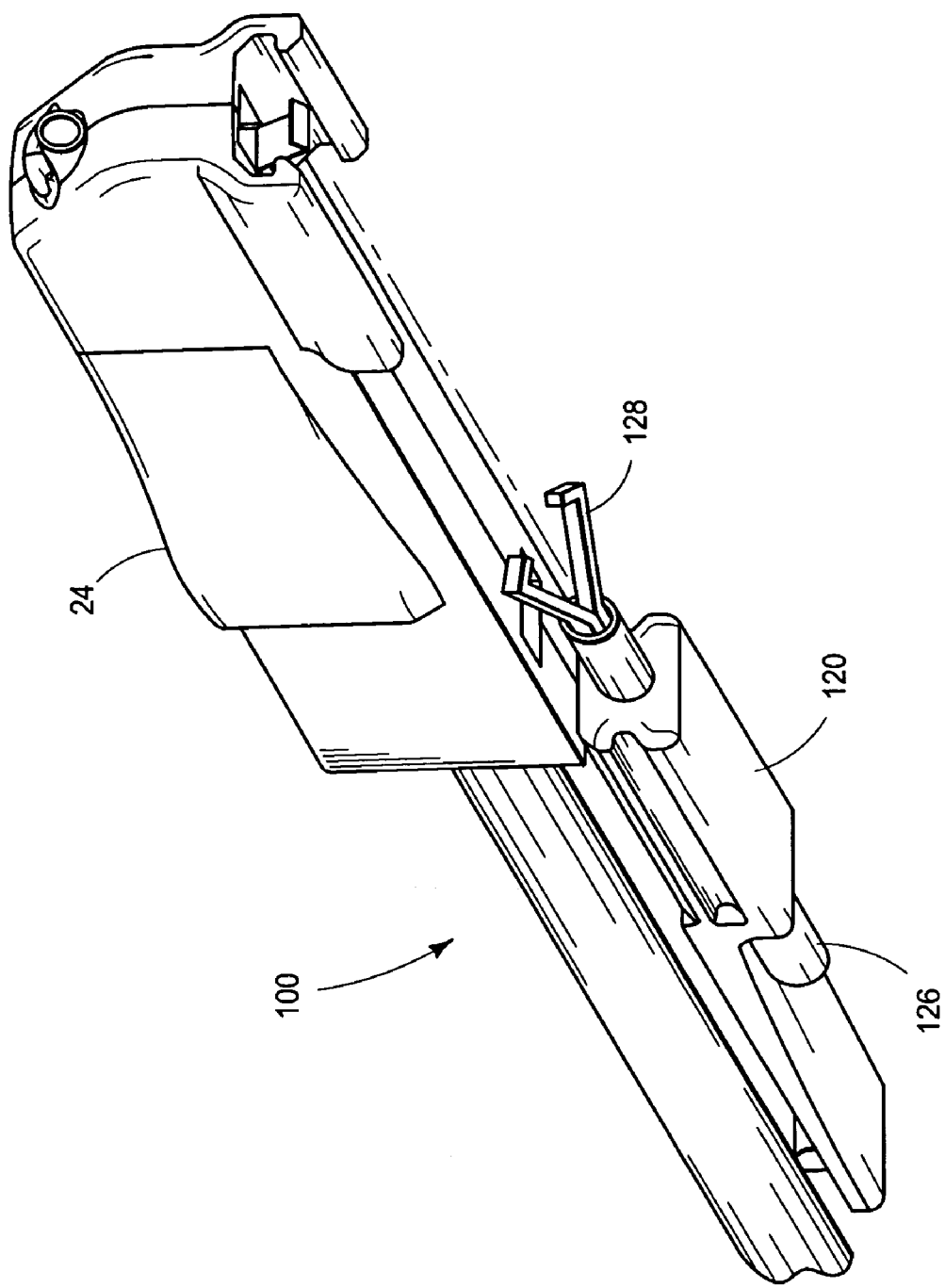
FIG. 5 is an exploded perspective view of one preferred embodiment of an electrical test probe with an integrated grabber cartridge of the present invention including a main probing head body and a probing tip grabber cartridge.
Figure 6:
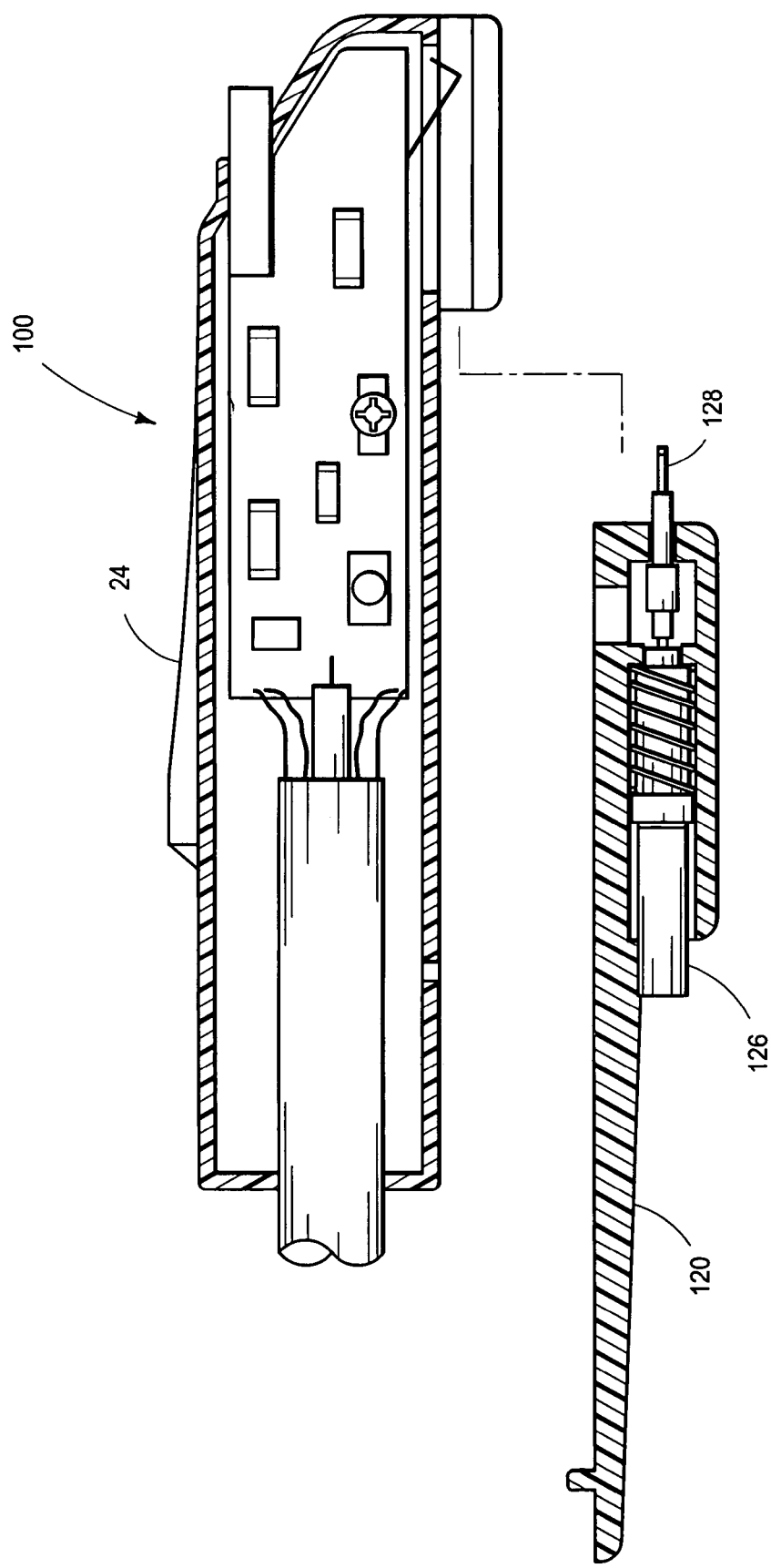
FIG. 6 is an exploded cross-sectional side view of the electrical test probe with an integrated grabber cartridge.
Figure 7:
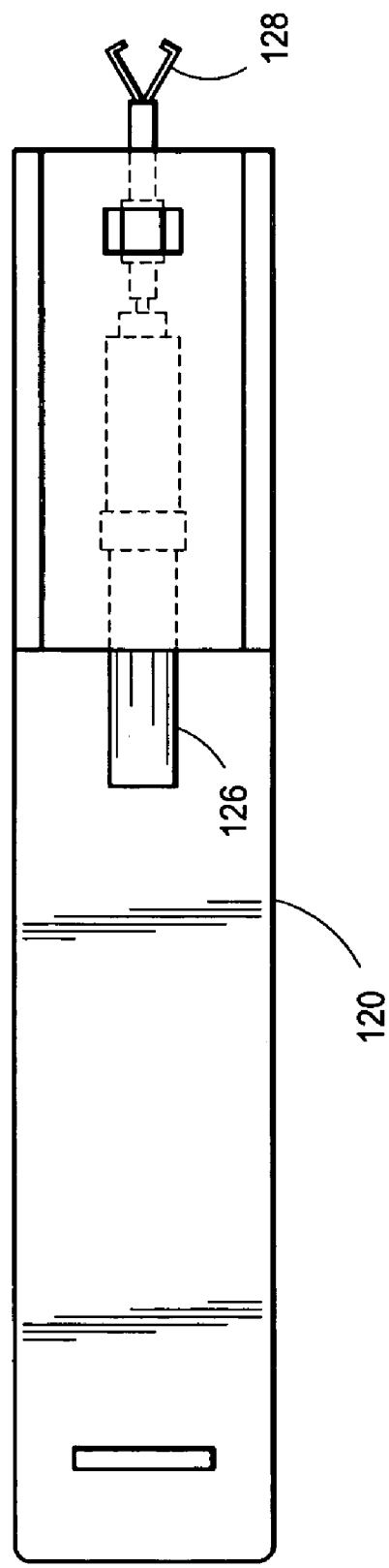
FIG. 7 is a bottom view of the integrated grabber cartridge.
Figure 8:
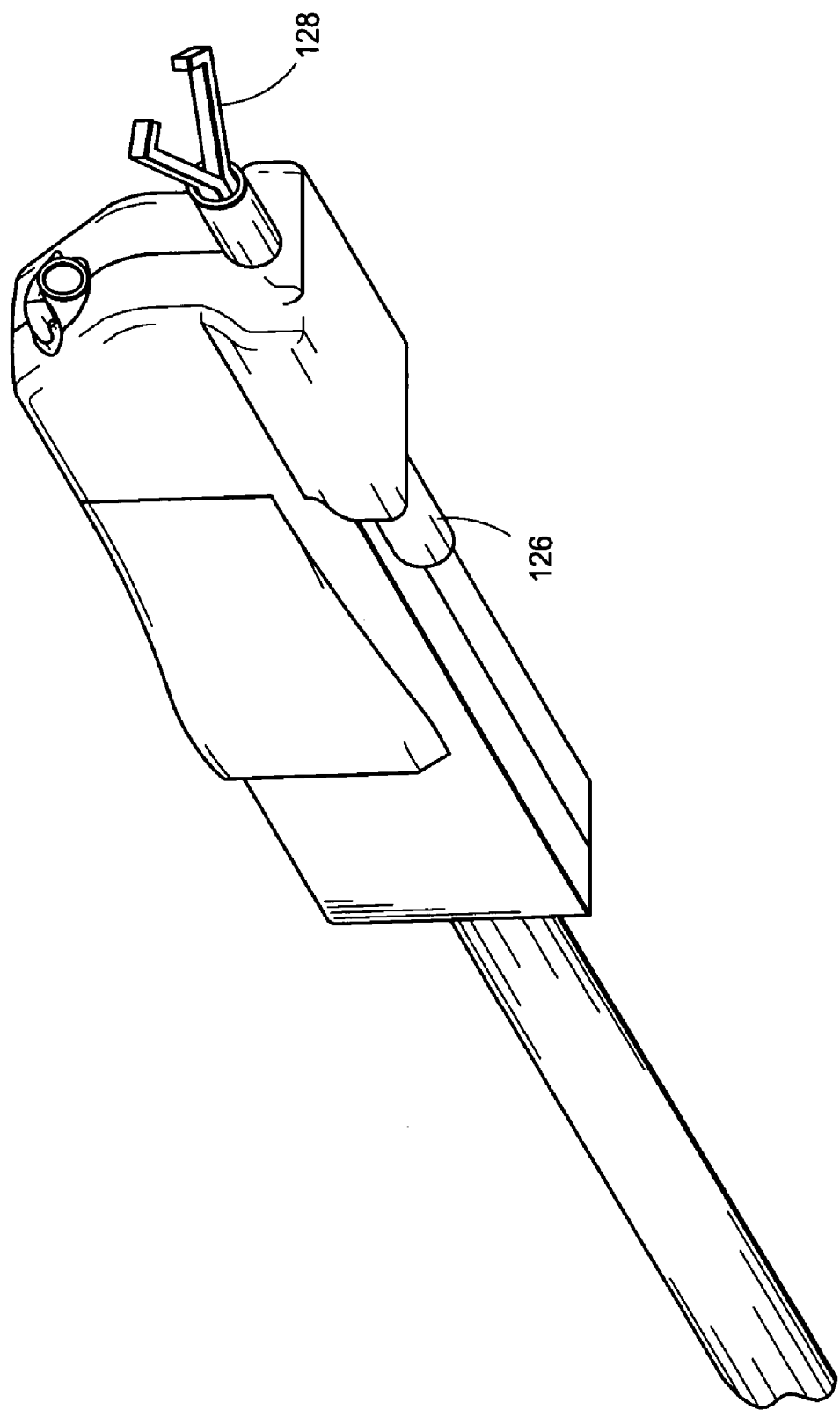
FIG. 8 is an exploded perspective view of an alternate preferred embodiment of a probing head with an integrated grabber of the present invention.
Figure 9:
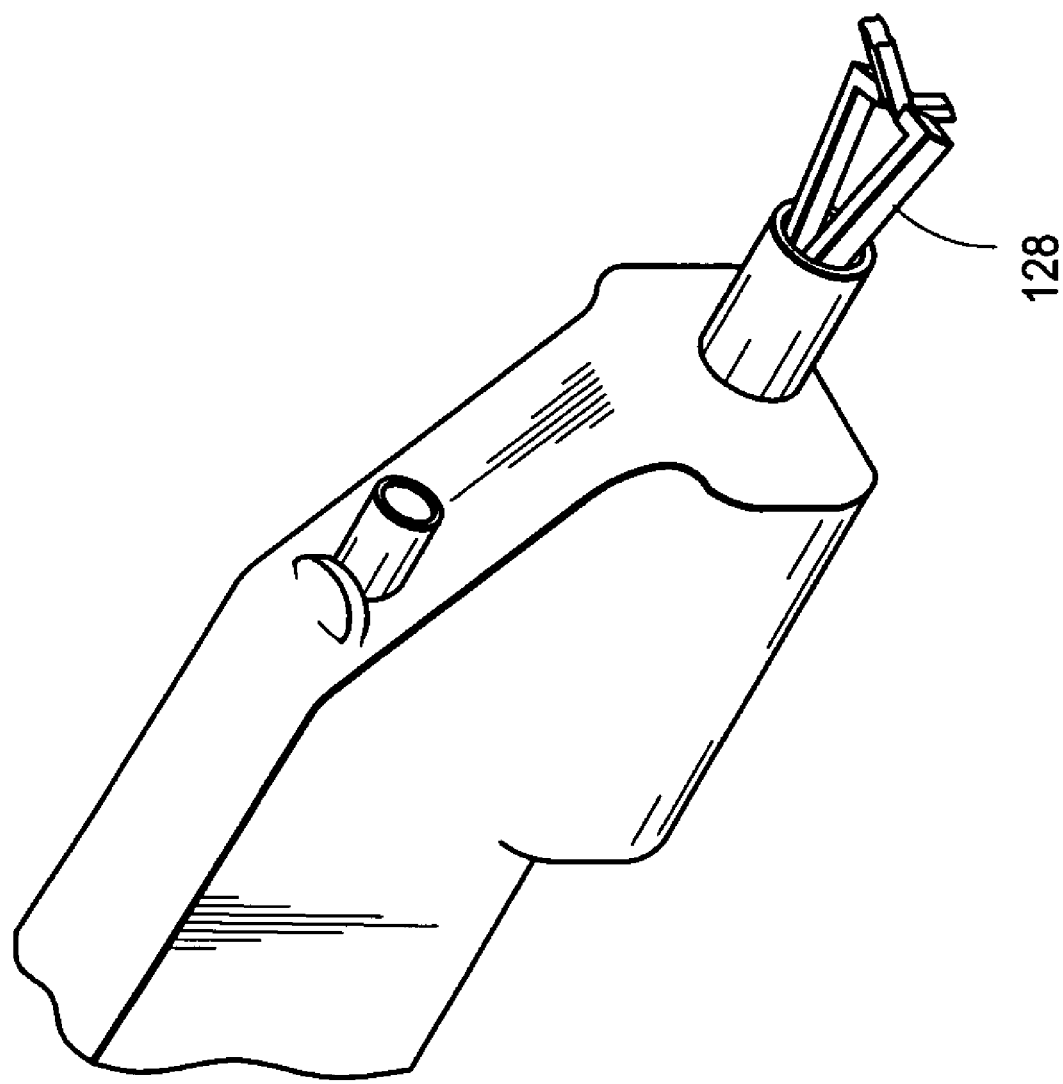
FIG. 9 is a perspective view of an integrated grabber coupling with a circuit board device.

FIGS. 5–9 show various embodiments of an integrated grabber 100. FIGS. 5–7 show an integrated grabber cartridge system in which the main probing head body 24 is substantially similar to that shown in FIGS. 1–4. The cartridge, however, is an integrated grabber cartridge 120. The actuator 126 and grabber tip 128 are exposed from the integrated grabber cartridge 120 at opposite ends so that by pushing and pulling the actuator 126 the grabber tip 128 opens and closes. It should be noted that alternate actuating means are possible (for example, a side actuator). FIG. 8 and FIG. 9 show an alternate embodiment of the integrated grabber in which the grabber is integrated into a cartridge that can be attached to a probing head body.

A method for using a cartridge system 20 of the present invention includes the step of protruding the electrical contact mechanism 32 from the main probing head body 24. Then the probing tip cartridge 26 is brought into mating relationship with the main probing head body 24. This causes the electrical contact mechanism 32 to be coupled electronically with the conductive surface 34. Finally, the probing tip cartridge 26 is secured in mating relationship with the main probing head body 24.

It should be noted that the step of bringing the probing tip cartridge 26 into mating relationship with the main probing head body 24 may be done in many ways. For example, as shown in FIGS. 1 and 2 the probing tip cartridge 26 may be slid forward so that the gripping surfaces 41b move forward into the gripping jaws 41a. In FIG. 4, on the other hand, the probing tip cartridge 26 slides backward into mating relationship with the main probing head body 24. Other types of connections could be used, for example, the probing tip cartridge 26 could be snap fit into mating relationship with the main probing head body 24. Other examples include adhesive, mechanical connectors, friction fits, or trapped in a living hinge.

It should be noted that the step of securing the probing tip cartridge 26 and the main probing head body 24 in mating relationship might be done in many different ways. For example, FIGS. 1–3 show an embodiment in which the step of securing further includes the step of extending a foot 42 of the probing tip cartridge 26 into the main probing head body 24 through an opening 44. Alternatively, FIG. 4 shows an embodiment in which the step of securing further includes the step of gripping both the probing tip cartridge 26 and the main probing head body 24 with a rear boot 46.

The method of the present invention also contemplates switching or replacing the probing tip cartridge 26 as needed by the user. To switch the probing tip cartridge 26 the user first releases the probing tip cartridge 26 from its mating relationship with the main probing head body 24. Then the user removes the probing tip cartridge 26. Next, the user provides a replacement probing tip cartridge 26 having a probing tip 30 with a conductive surface 34 defined therein, at least part of the conductive surface 24 being exposed. The user then brings the replacement probing tip cartridge 26 into mating relationship with the main probing head body 24. In doing this step the electrical contact mechanism 32 electrically couples with the conductive surface 34. Finally, the user secures the replacement probing tip cartridge 26 in mating relationship with the main probing head body 24.

It should be noted that the present invention contemplates that the probing tip cartridge 26 may be disposable. Alternatively, the probing tip cartridge 26 may have a socket as a probing tip 30 so that broken tips could be replaced.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A cartridge system for an electrical test probe, said system comprising:
    (a) a main probing head body;
    (b) electronics positioned within said main probing head body;
    (c) a minimally inductive electrical contact mechanism directly electrically coupled to said electronics, said electrical contact mechanism protruding from said main probing head body;
    (d) a probing tip cartridge interconnectable with said main probing head body;
    (e) a probing tip with a conductive surface, at least part of said conductive surface being exposed;
    (f) said probing tip interconnectable with said probing tip cartridge;
    (g) said probing tip cartridge being a switchable and replaceable probing tip cartridge;
    (h) said electrical contact mechanism contacting said conductive surface when said probing tip cartridge is in mating relationship with said main probing head body; and
    (i) a signal testing instrument functionally associatable with said probing tip so that a signal through said probing tip may be measured by said signal testing instrument;
    (j) wherein said cartridge system is suitable for high bandwidth applications.

2. The system of claim 1, said electronics being selectively electrically coupled to said signal testing instrument via a cable.

3. The system of claim 1, said probing tip cartridge being disposable.

4. The system of claim 1, said probing tip being a socket for receiving other probing tips.

5. The system of claim 1, said electrical contact mechanism being a signal spring contact.

6. The system of claim 1, said electrical contact mechanism being a leaf spring.

7. The system of claim 1, said probing tip cartridge being an integrated grabber cartridge.

8. The system of claim 1, further comprising:
    (a) said main probing head body having a set of gripping jaws; and
    (b) said probing tip cartridge having gripping surfaces;
    (c) wherein said gripping jaws grip said gripping surfaces.

9. The system of claim 1 wherein said probing tip cartridge is held in place by a foot extending into said main probing head body.

10. The system of claim 1 wherein said probing tip cartridge is held in place by a rear boot gripping both said probing tip cartridge and said main probing head body.

11. A method for using a cartridge system for an electrical test probe, said method comprising the steps of:
    (a) providing a main probing head body having electronics positioned therein and a minimally inductive electrical contact mechanism directly electrically coupled to said electronics;
    (b) providing a switchable and replaceable probing tip cartridge;
    (c) providing a probing tip with a conductive surface defined therein, at least part of said conductive surface being exposed, said probing tip interconnectable with said probing tip cartridge;
    (d) protruding said electrical contact mechanism from said main probing head body;
    (e) bringing said probing tip cartridge into mating relationship with said main probing head body;
    (f) coupling electronically said electrical contact mechanism with said conductive surface;
    (g) securing said probing tip cartridge in mating relationship with said main probing head body;
    (h) providing a signal testing instrument;
    (i) associating functionally said probing tip with said signal testing instrument; and
    (j) testing a high bandwidth signal through said probing tip using said signal testing instrument.

12. The method of claim 11 wherein said step of securing further comprises the step of securing said probing tip cartridge in mating relationship with said main probing head body by extending a foot of said probing tip cartridge into said main probing head body.

13. The method of claim 11 said step of securing further comprises the step of securing said probing tip cartridge in mating relationship with said main probing head body by gripping both said probing tip cartridge and said main probing head body with a rear boot.

14. The method of claim 11 further comprising the steps of:
    (a) releasing said probing tip cartridge from its mating relationship with said main probing head body;
    (b) removing said probing tip cartridge;
    (c) providing a replacement probing tip cartridge having a probing tip with a conductive surface defined therein, at least part of said conductive surface being exposed;

(d) bringing said replacement probing tip cartridge into mating relationship with said main probing head body;

(e) coupling electronically said electrical contact mechanism with said conductive surface; and (f) securing said replacement probing tip cartridge in mating relationship with said main probing head body.

15. The method of claim 11 further comprising the step of gripping surfaces of said probing tip cartridge using a set of gripping jaws of said main probing head body.

16. A cartridge system for an electrical test probe, said system comprising:

(a) a main probing head body;

(b) electronics positioned within said main probing head body;

(c) a switchable and replaceable probing tip cartridge;

(d) a probing tip interconnectable with said probing tip cartridge; and (e) a minimally inductive electrical contact mechanism for electrically coupling said electronics to said probing tip when said probing tip cartridge is in mating relationship with said main probing head body.

17. The system of claim 16, said electrical contact mechanism protruding from said main probing head body.

18. The system of claim 16, said electronics being selectively electrically coupled to a signal testing instrument via a cable.

19. The system of claim 16, said probing tip cartridge being held in place by at least one foot extending into said main probing head body.

* * * * *